United States Patent [19]

Chang et al.

[11] Patent Number: 5,137,837
[45] Date of Patent: Aug. 11, 1992

[54] RADIATION-HARD, HIGH-VOLTAGE SEMICONDUCTIVE DEVICE STRUCTURE FABRICATED ON SOI SUBSTRATE

[75] Inventors: Chen-Chi P. Chang, Newport Beach; Mei F. Li, Mission Viejo, both of Calif.

[73] Assignee: Hughes Aircraft Company, Los Angeles, Calif.

[21] Appl. No.: 569,304

[22] Filed: Aug. 20, 1990

[51] Int. Cl.$^5$ ................ H01L 21/265; H01L 21/70
[52] U.S. Cl. ..................... 437/21; 437/56; 437/67
[58] Field of Search ............ 437/21, 56, 62, 67, 437/228

[56] References Cited

U.S. PATENT DOCUMENTS

| | | | |
|---|---|---|---|
| 4,183,134 | 1/1980 | Oehler et al. | 29/571 |
| 4,385,937 | 5/1983 | Ohmura | 437/21 |
| 4,507,158 | 3/1985 | Kamins et al. | 148/175 |
| 4,593,459 | 6/1986 | Poppert et al. | 29/577 C |
| 4,668,973 | 5/1987 | Dawson et al. | 357/54 |
| 4,692,992 | 9/1987 | Hsu | 437/67 |
| 4,749,660 | 6/1988 | Short et al. | 437/24 |
| 4,797,721 | 1/1989 | Hsu | 357/23.7 |
| 4,903,108 | 2/1990 | Young et al. | 437/62 |
| 4,943,537 | 7/1990 | Harrington, III | 437/34 |
| 5,006,479 | 4/1991 | Brandewie | 437/67 |
| 5,032,529 | 7/1991 | Beitman et al. | 437/21 |

FOREIGN PATENT DOCUMENTS

| | | | |
|---|---|---|---|
| 0083089 | 7/1983 | European Pat. Off. | 437/67 |
| 59-13333 | 1/1984 | Japan | 437/67 |

*Primary Examiner*—Olik Chaudhuri
*Assistant Examiner*—Loc Q. Trinh
*Attorney, Agent, or Firm*—Jeannette M. Walder; Terje Gudmestad; W. K. Denson-Low

[57] ABSTRACT

Highly doped N- and P-type wells (16a, 16b) in a first silicon layer (16) on an insulator layer (14) of a SIMOX substrate (10). Complementary MOSFET devices (52,54,58,62) are formed in lightly doped N- and P-type active areas (22a, 22b) in a second silicon layer (22) formed on the first silicon layer (16). Adjacent active areas (22a, 22b) and underlying wells (16a, 16b) are isolated from each other by trenches (36,78) filled with a radiation-hard insulator material. Field oxide layers (42,64) are formed of a radiation-hard insulator material, preferably boron phosphorous silicon dioxide glass, over the surface of the second silicon layer (22) except in contact areas (68) of the devices (52,54,58,62). The devices (52,54,58,62) are formed in the upper portions of the active areas (22a, 22b), and are insensitive to the interfacial states of the SIMOX substrate (10). The buried wells (16a, 16b) under the active areas (22a, 22b) have low resistance and enable the devices (52,54,58,62) to have high snap-back voltages. The absence of sharp edges also eliminates edge leakage upon high dosage irradiation, thus producing devices that are more radiation-resistant.

10 Claims, 5 Drawing Sheets

RADIATION-HARD, HIGH-VOLTAGE SEMICONDUCTIVE DEVICE STRUCTURE FABRICATED ON SOI SUBSTRATE

BACKGROUND OF THE INVENTION

1. Field of the Invention

The present invention relates to the fabrication of semiconductive devices on silicon-on-insulator (SOI) substrates, preferably substrates formed through the separation by implantation of oxygen (SIMOX) process, which are radiation-hard and capable of high voltage operation.

2. Description of the Related Art

Various operating environments for semiconductor devices such as complementary metal-oxide-semiconductor field-effect transistors (CMOS FETs) require that they be resistant to radiation. Exposure to radiation can cause conventional devices to malfunction or destruct.

Radiation hardness may be improved by fabricating devices on SOI substrates. A preferred SOI material is SIMOX, as described in an article entitled "Silicon-on-insulator by oxygen implantation: An advanced technology", by M. Bruel et al, in Microelectronic Engineering 8 (1988), pp. 149–161. The buried insulator layer reduces radiation-induced back channel leakage to a negligible level, and eliminates latch-up paths between adjacent devices which are present in conventional bulk semiconductor substrates.

Although conventional SIMOX devices are essentially free from latch-up, more radiation-hard than devices formed on bulk substrates, and will operate reliably at low voltages, the maximum snap-back voltages are relatively low, on the order of 4 to 7 volts. Snap-back occurs due to an accumulation of charge carriers in doped well regions of a device, and produces a catastrophic increase in current gain resulting in destruction of the device if the operating voltages are increased above the snap-back voltage.

SUMMARY OF THE INVENTION

In a semiconductive device structure embodying the present invention, highly doped N- and P-type wells are formed in a first silicon layer on an insulator layer of a SIMOX substrate. Complementary MOSFET devices are formed in lightly doped N- and P-type active areas in a second silicon layer formed on the first silicon layer. Adjacent active areas and underlying wells are isolated from each other by trenches filled with a radiation-hard insulator material. A field oxide layer is formed of a radiation-hard insulator material, preferably chemical-vapor-deposition doped silicon dioxide glass, over the surface of the second silicon layer except in contact areas of the devices. The devices are formed in the upper portions of the active areas, and are insensitive to the interfacial states of the SIMOX substrate. The buried wells under the active areas have low resistance, and enable the devices to have high snap-back voltages.

The wells are formed in the first silicon layer by ion implantation, and the second silicon layer is epitaxially deposited on the first layer. The active areas are then implanted in the second layer. The trenches between the adjacent active areas and underlying buried wells may be formed by etching the trenches part way, and then thermally oxidizing the walls of the trenches to fill them and extend the oxidation the rest of the way through the silicon layers to the insulator layer. Alternatively, the trenches may be etched all the way down through the silicon layers to the insulator layer, and a layer of boron silicon dioxide glass deposited over the surface of the structure and into the trenches. The glass is then etched away to expose and planarize the surface of the second silicon layer and the surface of the filled trenches.

By fabricating the structure on SIMOX wafers, the devices are latch-up free and radiation hardened for high voltage analog applications. The buried wells below the epitaxial silicon layer enhance the latch-up and snap-back resistances. Absence of sharp edges eliminates edge leakage upon high dosage irradiation. High speed devices are achieved because of the shallow junctions, trench and field oxide isolation, and the ability to be scaled down like normal bulk silicon devices.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
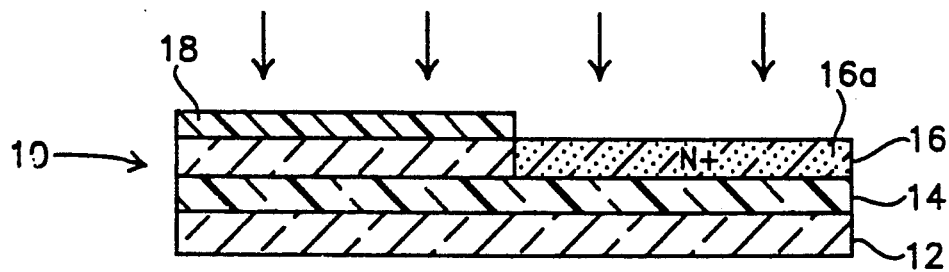
FIGS. 1 to 19 are simplified sectional views illustrating a method for fabricating a radiation-hard semiconductive device structure embodying the present invention.

Referring now to FIG. 1 of the drawing, a process or method for fabricating a semiconductive device structure embodying the present invention includes providing a substrate which includes a semiconductive layer formed on an insulator layer. The preferred semiconductive material for practicing the invention is silicon. However, the concept of the invention is not limited to silicon, and may be applied to other material systems having suitable properties.

As viewed in FIG. 1, a substrate 10, which is preferably provided as a wafer fabricated by the SIMOX process, includes a bulk silicon layer 12, and an insulator layer 14 formed in the upper surface portion of the bulk layer 12 as a buried silicon dioxide layer. A monocrystalline silicon layer 16 is formed over the insulator layer 14 as part of the SIMOX process. The silicon layer 16 is preferably of device quality from its surface down to close proximity with its interface with the insulator layer 14. A preferred thickness for the silicon layer 16 is 0.24 microns, but the thickness may vary within the range of approximately 0.1 to 3 microns depending on the design requirements of a particular application. Although the drawings illustrate the fabrication of only one pair of complementary field effect transistor semiconductor devices on the substrate 10, it will be understood that this is merely to facilitate the description of the invention, and that in actual practice of the present method, large numbers of devices will be fabricated simultaneously on one SIMOX wafer.

Although not illustrated, a target mask may be applied for etching the silicon layer 16 to form alignment targets for subsequent photolithographic masking operations. An N well photoresist mask 18 is then formed on the layer 16 using the conventional steps of forming a photoresist layer on the surface of the layer 16, exposing the photoresist layer through an optical mask (not shown), and using a developer solution to dissolve away the areas of the photoresist layer which were not covered by the optical mask. Phosphorous ions are implanted into the layer 16 to form a heavily doped N+ well 16a in the area of the layer 16 not covered by the mask 18. The implantation energy and dosage are selected to produce a preferred doping concentration of approximately $6 \times 10^{18}$ cm$^{-3}$ in the well 16a. However, this particular doping concentration is not limitative of the invention.

Figure 2:
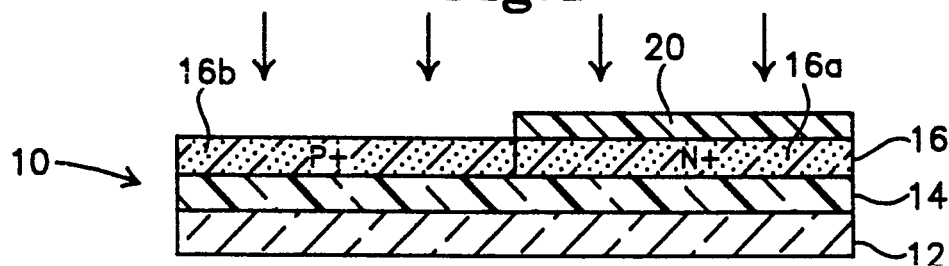

As shown in FIG. 2, the mask 18 is removed, and a complementary operation is performed using a P well mask 20 and implantation of boron ions to approximately the same doping concentration as the phosphorous ions to form a highly doped P+ well 16b in the layer 16 which is adjacent to N+ well 16a.

Figure 3:
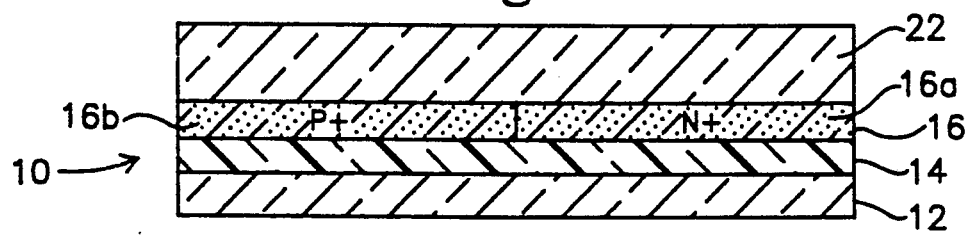

In the next step illustrated in FIG. 3, the mask 20 is removed, and a second monocrystalline silicon layer 22 is epitaxially deposited on the first layer 16. The layer 22 preferably has a thickness of one micron, but may vary within the range of approximately 1 to 5 microns depending on the particular application.

Figure 4:
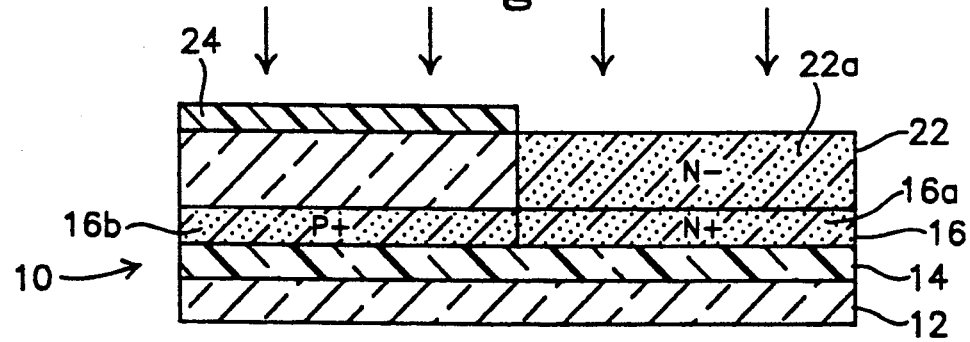

As shown in FIG. 4, a photoresist mask 24 is formed on the layer 22, and phosphorous ions are implanted into the layer 16 to form a lightly doped N- active area 22a in the portion of the layer 22 not covered by the mask 24. The implantation energy and dosage are selected to produce a preferred doping concentration within the range of approximately $10^{15}$ to $10^{16}$ cm$^{-3}$ in the active area 22a. However, this particular doping concentration is not limitative of the invention.

Figure 5:
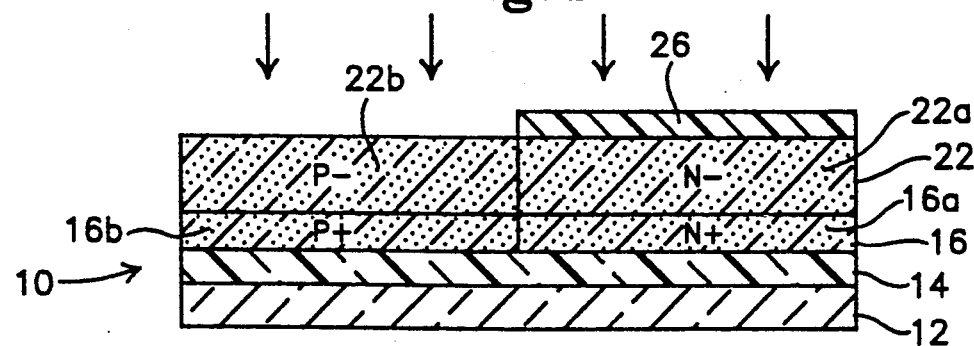

As shown in FIG. 5, the mask 24 is removed, and a complementary operation is performed using a photoresist mask 26 and implantation of boron ions to approximately the same doping concentration as the phosphorous ions to form a lightly doped P- active area 22b in the layer 22 which is adjacent to and laterally spaced from the N- active area 22a.

Although phosphorous was described as being used for N doping in the steps of FIGS. 1 and 4, the invention is not so limited, and other suitable materials such as arsenic or antimony may be used in accordance with a particular application. Similarly, other P type dopant materials such as aluminum or gallium may be substituted for boron in the steps of FIGS. 2 and 5.

Figure 6:
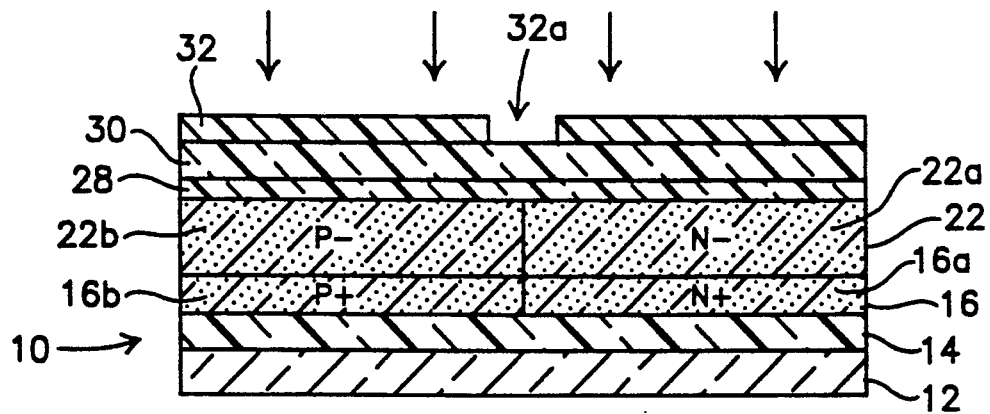

In FIG. 6, a thin silicon dioxide layer 28, on the order of 300 Angstroms thick, is formed on the silicon layer 22, and a silicon nitride layer 30 approximately 0.12 microns thick is formed on the layer 28. The layer 28 acts as a "pad oxide" which enhances the adhesion between the layers 30 and 22. A separation mask 32 is then formed of photoresist on the layer 30. The mask 32 has an opening 32a which straddles the interface between the laterally adjacent active areas 22a and 22b of the silicon layer 22.

Figure 7:
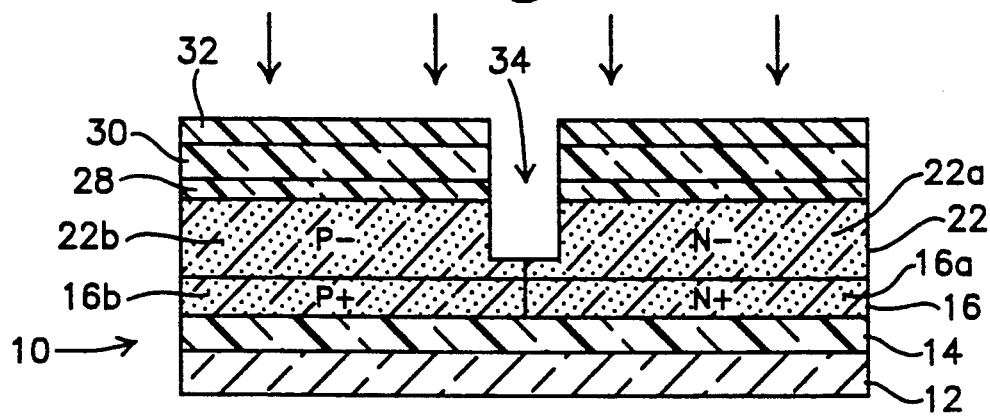

The silicon nitride layer 30, thin oxide layer 28, and at least part of the silicon layer 22 are etched through the opening 32a of the mask 32 using anisotropic dry etching or the like to form a partial trench 34 shown in FIG. 7. Typically, the partial trench 34 will be etched to a depth of approximately one-half the combined thicknesses of the layers 16 and 22.

The structure shown in FIG. 7 is subjected after removal of the mask 32 to thermal oxidation to grow silicon dioxide on the walls and bottom of the partial trench 34 to a thickness of approximately one micron or larger thickness for thicker epitaxial silicon films. In addition to filling the partial trench 34, the oxidation converts the silicon layers 22 and 16 below the bottom of the partial trench 34 into silicon dioxide which merges with the underlying insulator layer 14. The result is a full trench 36 shown in FIG. 8 filled with silicon dioxide 38 which separates the N type active area 22a and well 16a from the P type active area 22b and well 16b. The silicon nitride layer 30 prevents oxidation of the silicon layer 22.

Figure 8:
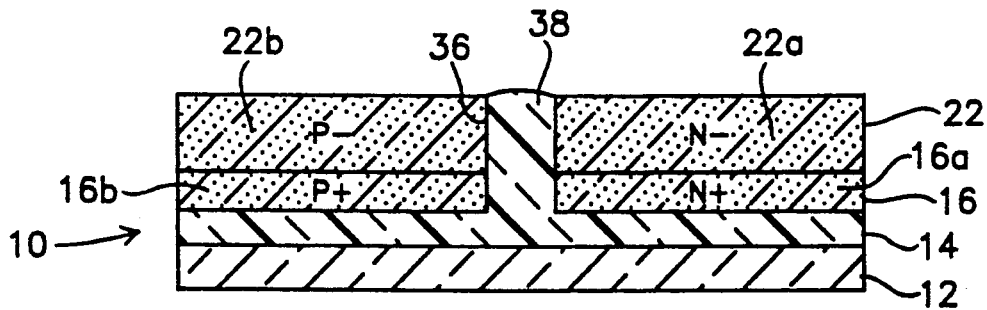

The layers 28 and 30 are then etched away to produce the structure illustrated in FIG. 8. It will be noted that the surface of the silicon dioxide 38 in the trench 36 is substantially planarized with the surface of the silicon layer 22. The trench 36 completely separates the areas of opposite conductivity types and positively prevents latch-up between devices fabricated in the active areas 22a and 22b. In addition, the silicon dioxide 38 in the trench 36 is unaffected by even high doses of radiation.

Figure 9:
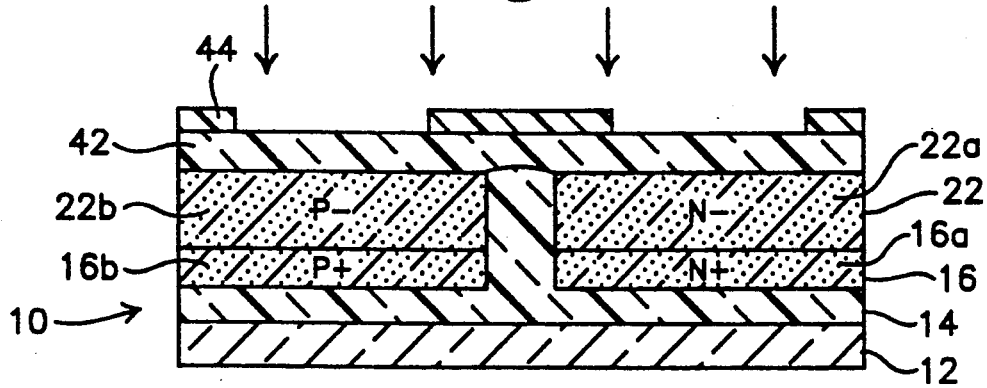
Figure 10:
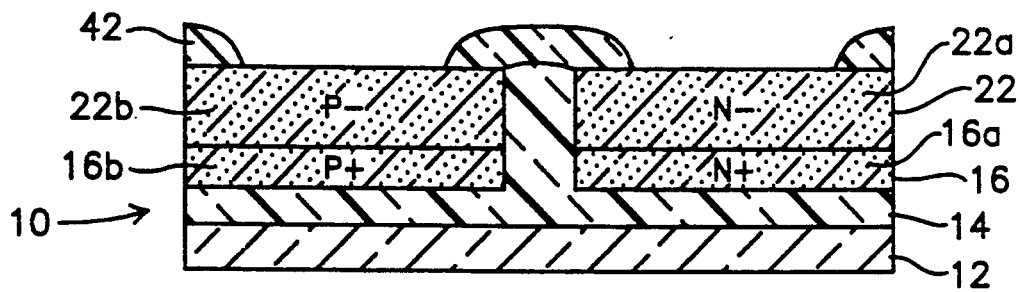

In the step of FIG. 9, a radiation-hard field oxide layer 42, preferably of chemical-vapor-deposition doped glass, is deposited on the layer 22 and exposed surface of silicon dioxide 38 in the trench 36. An active area mask 44 of photoresist is formed on the glass layer 42. The area of the layer 42 which is not covered by the mask 44 is etched away by plasma oxide etching or the like. The mask 44 is then dissolved away to produce the structure illustrated in FIG. 10.

Figure 11:
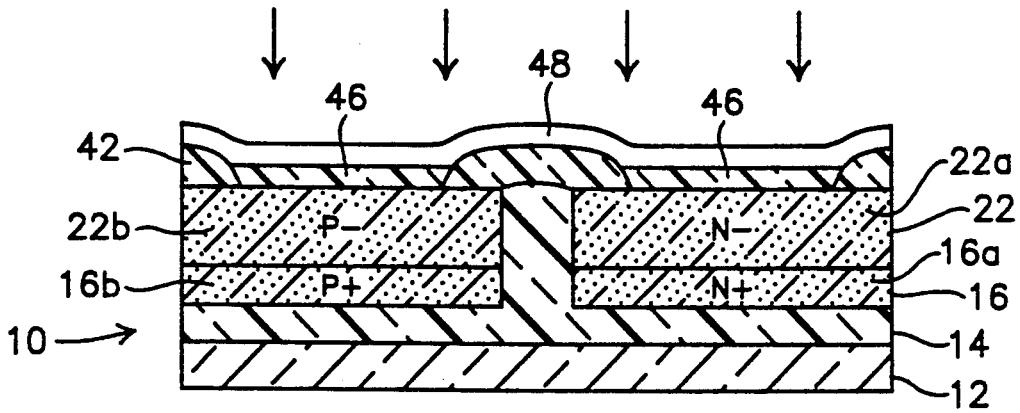
Figure 12:
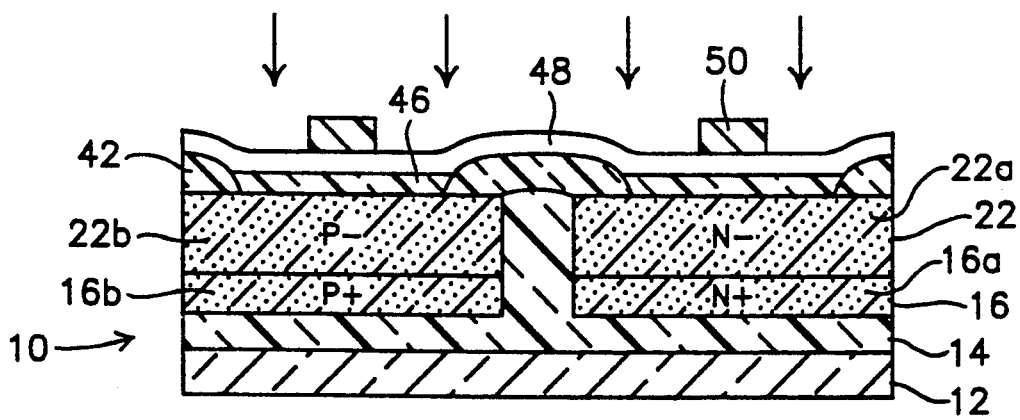
Figure 13:
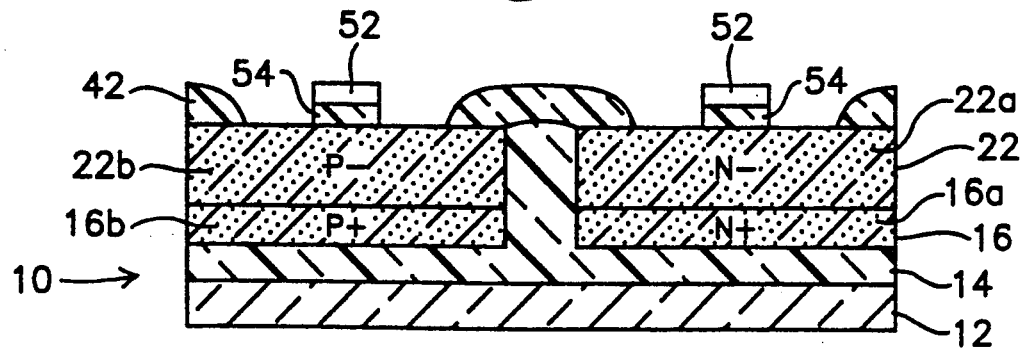

In the next step of FIG. 11, a gate oxide layer 46 is thermally grown on the exposed surface areas of the silicon layer 22 to a thickness of approximately 200 Angstroms, and a polysilicon layer 48 is deposited over the structure. Phosphorous ions are then implanted into the polysilicon layer 48 to provide a high level of N conductivity type doping. A photoresist mask 50 is then formed on the polysilicon layer 48 as shown in FIG. 12, and the layers 46 and 48 are etched away in the areas which are not covered by the mask 50. The resulting structure, after removal of the mask 50, is illustrated in FIG. 13, and includes conductive polysilicon gates 52 formed on insulative gate oxide layers 54.

Figure 14:
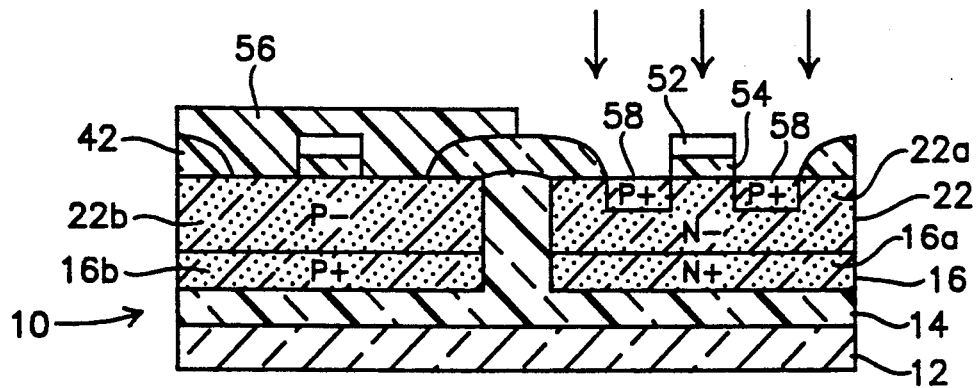

In the next step of FIG. 14, the active area 22b is covered with a photoresist mask 56, and boron ions are implanted in the uncovered active area 22a to form highly doped P+ source/drain regions 58. The doping concentration is preferably at least $10^{20}$ cm$^{-3}$. The area under the gate 52 and gate oxide layer 54 formed on the active area 22a is shielded thereby from ion implantation, and constitutes a channel region (not designated). The source/drain regions 58 are interchangeable, and constitute a P-channel, enhancement mode MOS field effect transistor semiconductive device in combination with the gate 52, gate oxide layer 54, and channel region of the active area 22a.

Figure 15:
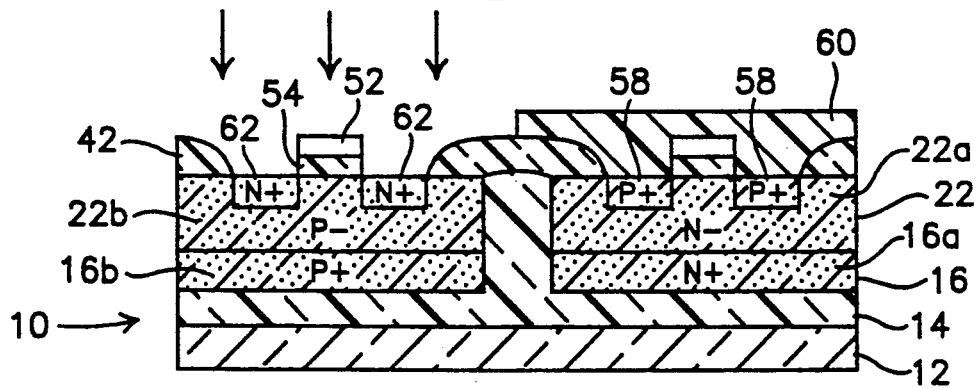

In the next step of FIG. 15, the active area 22a is covered with a photoresist mask 60, and phosphorous or arsenic ions are implanted in the uncovered active area 22b to form highly doped N+ source/drain regions 62. The doping concentration is on the same order as that of the source/drain regions 58. The area under the gate 52 and gate oxide layer 54 formed on the active area 22b is shielded thereby from ion implantation, and constitutes a channel region (not designated). The source/drain regions 62 are interchangeable, and constitute an N-channel, enhancement mode MOS field effect transistor semiconductive device in combination with the gate 52, gate oxide layer 54, and channel region of the active area 22b.

The ion implantation in the steps of FIGS. 14 and 15 is preferably controlled to form the source/drain regions 58 and 62 to a depth within the range of approximately 0.3 to 0.6 microns in the layer 22.

Figure 16:
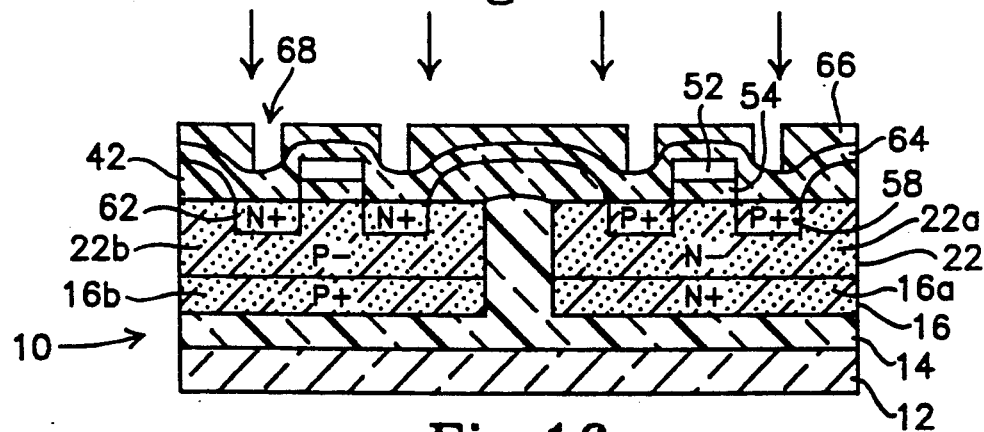
Figure 17:
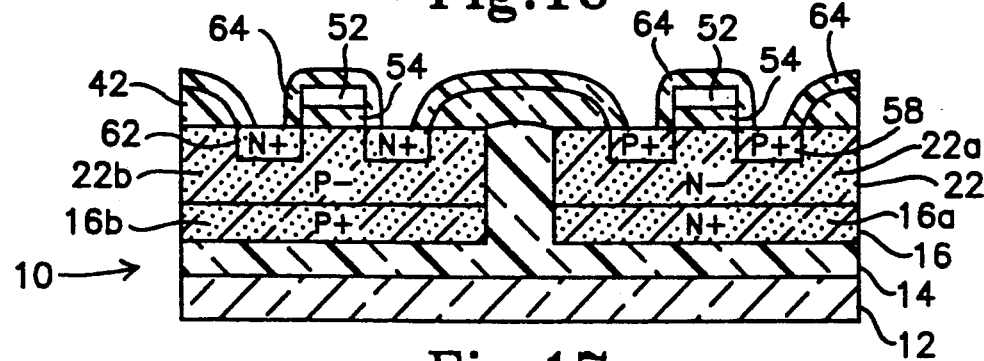

In FIG. 16, another field oxide layer of boron phosphorous silicon dioxide glass 64 is formed over the structure, and a contact mask 66 is formed over the active areas 22a and 22b except in areas 68 which are to provide electrical contact with external devices. The glass layer 64 is etched away in the contact areas 68 which are not covered by the mask 66, and the mask 66 is removed to produce the structure shown in FIG. 17.

Figure 18:
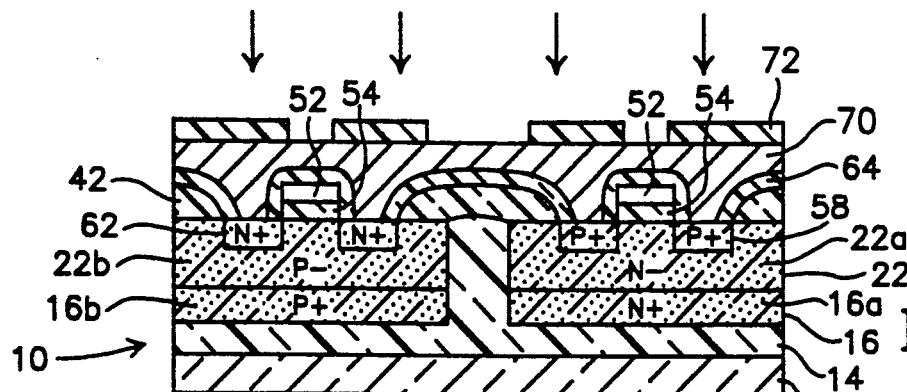
Figure 19:
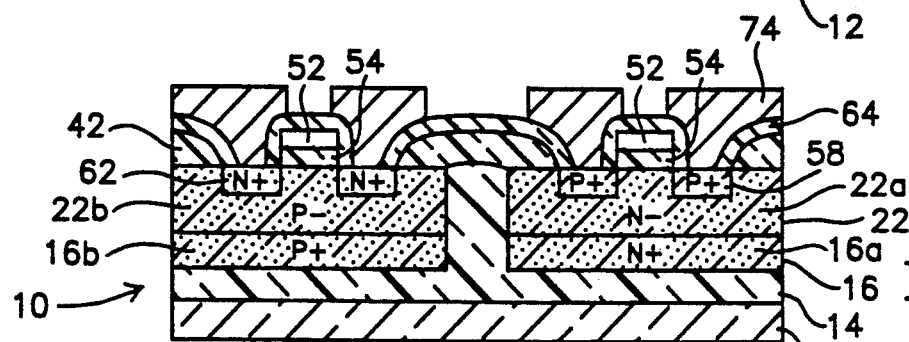

In FIG. 18, a metallization layer 70 of aluminum, gold, silver, or other electrically conductive material is formed on the structure, and a metallization mask 72 is formed on the layer 70 over the contact areas 68. The metallization layer 70 is etched away in the areas not covered by the mask 72, and the mask 72 is removed to produce the structure illustrated in FIG. 19. The areas of the metallization layer 70 which were not etched away in the step of FIG. 18 are designated as ohmic contacts 74 in FIG. 19. Although only the contacts 74 for the source/drain regions 58 and 62 are visible in the drawing, contacts for the gates 52 which extend external of the active areas will also be formed in accordance with the present invention.

Figure 20:
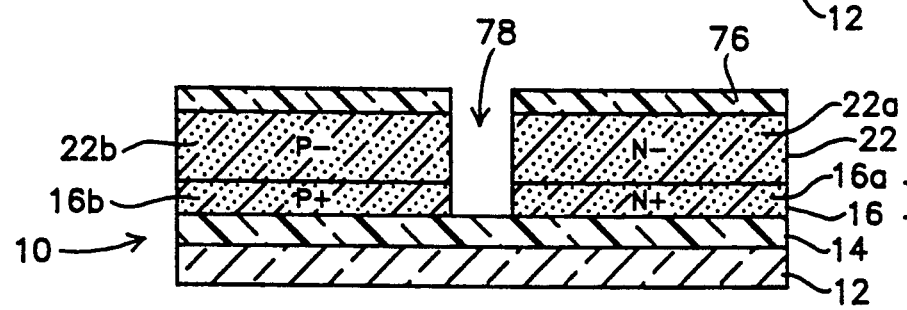
FIGS. 20 to 22 are simplified sectional views illustrating an alternative method of performing the steps of FIGS. 6 to 8.
Figure 21:
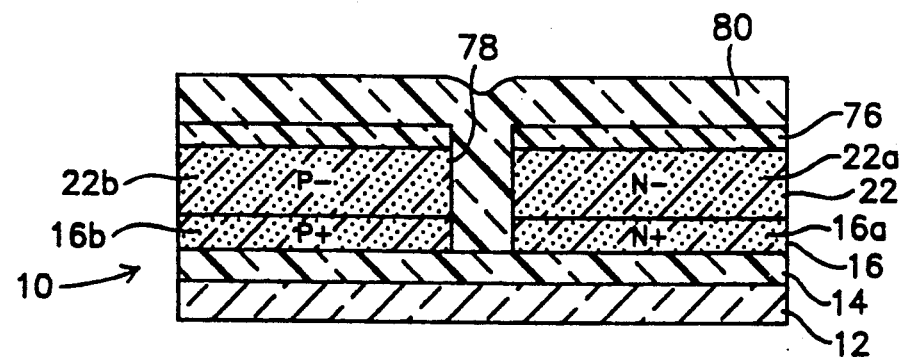
Figure 22:
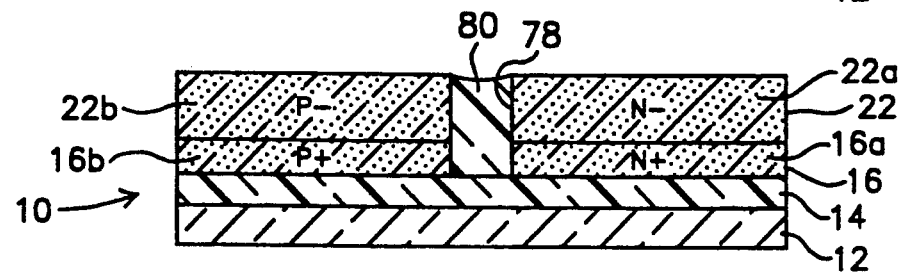

An alternative method for forming the insulative trenches between the semiconductor device areas is illustrated in FIGS. 20 to 22. The method shown in these figures replaces the steps illustrated in FIGS. 6 to 8. In FIG. 20, a 500 Angstrom thick layer 76 of silicon dioxide is thermally grown on the silicon layer 22. A trench 78 approximately 2.5 microns wide which separates the opposite conductivity regions of the structure is etched all the way down to the insulator layer 14 using a suitable separation mask (not shown). A layer of boron silicon dioxide glass 80 is deposited over the surface of the structure to a thickness of approximately 1.3 microns, thereby filling the trench 78. The layers 80 and 76 are etched using plasma oxide etching or the like to expose the layer 22. As the result of these steps, the surface of the boron silicon dioxide glass 80 which fills the trench 78 is planarized to the surface of the layer 22.

The present process enables the snap-back voltages of the semiconductive devices formed in the active areas 22a and 22b to be increased to above 10 volts. The buried wells 16a and 16b are formed independently and separated by the radiation-hard, insulator-filled trench 36 or 78, which provides adequate device isolation for high voltage applications. The buried wells 16a and 16b provide low well resistance, which increases the snap-back voltages of the semiconductor devices.

The radiation-hard chemical-vapor-deposition field oxide layers 42 and 64 provide additional radiation hardness for the devices and enhanced isolation due to high field inversion voltages. The devices have low leakages, and the surface of the structure is flat, without undesirable sharp edges or steps. Devices fabricated using the present method have a speed advantage over bulk silicon devices due to lower capacitances. The present fabrication method is simple, and compatible with bulk silicon process steps.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A method of fabricating a radiation-hard semiconductive device structure, comprising the steps of:
   (a) providing a substrate including a first semiconductive layer on an insulator layer;
   (b) forming first and second laterally adjacent wells of first and second opposite conductivity types respectively in the first semiconductive layer;
   (c) forming a second semiconductive layer over the first semiconductive layer;
   (d) forming first and second active areas of the first and second conductivity types in the second semiconductive layer over the first and second wells respectively;
   (e) forming a trench through the first and second semiconductive layers to separate the first well and first active area from the second well and second active area;
   (f) filling the trench with a radiation-hard insulator material;
   (g) forming first and second semiconductive devices in the first and second active areas respectively, the first and second devices having contact areas; and
   (h) forming a field oxide layer of radiation-hard insulator material over the second semiconductive layer except for the contact areas of the first and second devices.

2. A method as in claim 1, in which:
   step (a) comprises providing the substrate as having the first semiconductive layer formed of silicon; and
   step (c) comprises forming the second semiconductive layer of silicon.

3. A method as in claim 2, in which:
   step (b) comprises forming the first and second wells with relatively high concentrations of dopants of the first and second conductivity types respectively; and
   step (c) comprises forming the first and second active areas with relatively low concentrations of dopants of the first and second conductivity types respectively.

4. A method as in claim 3, in which step (b) comprises the substeps of:
   (i) forming the first well by implantation of boron ions to a concentration of approximately $6 \times 10^{18}$ cm$^{-3}$; and
   (j) forming the second well by implantation of phosphorous ions to a concentration of approximately $6 \times 10^{18}$ cm$^{-3}$.

5. A method as in claim 3, in which step (c) comprises the substeps of:
   (i) forming the first active area by implantation of boron ions to a concentration of approximately $10^{15}$ to $10^{16}$ cm$^{-3}$; and
   (j) forming the second active area by implantation of phosphorous ions to a concentration of approximately $10^{15}$ to $10^{16}$ cm$^{-3}$.

6. A method as in claim 2, in which:
   step (a) comprises providing the substrate as including the first semiconductive layer formed to a thickness within the range of approximately 0.1 to 3 microns; and step (c) comprises forming the second semiconductive layer to a thickness within the range of approximately 1 to 5 microns.

7. A method as in claim 1, in which steps (e) and (f) in combination comprise the substeps of:

(i) etching partially through at least the second semiconductive layer to form a partial trench; and (j) thermally oxidizing the walls and bottom of the partial trench with a radiation-hard oxide such that the oxide grows to fill the partial trench and extends completely through the second and first semiconductive layers to the insulator layer to create and fill said trench.

8. A method as in claim 1, in which step (f) comprises the substeps of:

(i) depositing the insulator material over the surface of the second semiconductive layer and into the trench; and (j) etching away the insulator material to expose the second semiconductive layer.

9. A method as in claim 1, in which:

step (a) comprises providing the substrate as having the first semiconductive layer formed of silicon;

step (c) comprises forming the second semiconductive layer of silicon to a thickness within the range of approximately 1 to 5 microns; and step (g) comprises forming the first and second devices in the first and second active areas to a depth within the range of approximately 0.3 to 0.6 microns.

10. A method as in claim in which step (h) comprises forming the field oxide layer of boron phosphorous silicon dioxide glass.

* * * * *